US007113255B2

(12) United States Patent
Poultney et al.

(10) Patent No.: US 7,113,255 B2
(45) Date of Patent: Sep. 26, 2006

(54) GRATING PATCH ARRANGEMENT, LITHOGRAPHIC APPARATUS, METHOD OF TESTING, DEVICE MANUFACTURING METHOD, AND DEVICE MANUFACTURED THEREBY

(75) Inventors: Sherman Poultney, Wilton, CT (US); Haico Victor Kok, Eindhoven (NL)

(73) Assignee: ASML Holding N.V., Veldhoven (NL)

( * ) Notice: Subject to any disclaimer, the term of this patent is extended or adjusted under 35 U.S.C. 154(b) by 79 days.

(21) Appl. No.: 10/739,525

(22) Filed: Dec. 19, 2003

(65) Prior Publication Data

US 2005/0134824 A1   Jun. 23, 2005

(51) Int. Cl.
*G03B 27/42* (2006.01)

(52) U.S. Cl. .................. 355/53; 356/399; 356/400; 355/67; 355/71

(58) Field of Classification Search .............. 355/53, 355/67–69; 250/548; 430/22, 30, 312; 356/124, 356/401, 503, 508
See application file for complete search history.

(56) References Cited

U.S. PATENT DOCUMENTS

| | | | | |
|---|---|---|---|---|
| 4,585,342 A | * | 4/1986 | Lin et al. | 356/124 |
| 5,814,425 A | * | 9/1998 | Kataoka et al. | 430/30 |
| 5,973,773 A | * | 10/1999 | Kobayashi | 356/124 |
| 6,057,065 A | | 5/2000 | Rolson | |
| 6,088,103 A | * | 7/2000 | Everett et al. | 356/503 |
| 6,285,033 B1 | * | 9/2001 | Matsumoto | 250/548 |
| 6,780,550 B1 | * | 8/2004 | Laughery et al. | 430/22 |
| 6,864,956 B1 | * | 3/2005 | Teong et al. | 355/53 |
| 2003/0001107 A1 | | 1/2003 | Kroon et al. | |
| 2003/0212525 A1 | * | 11/2003 | Bischoff et al. | 702/127 |

FOREIGN PATENT DOCUMENTS

| | | |
|---|---|---|
| EP | 0 247 665 B1 | 11/1993 |
| EP | 0 418 054 B1 | 11/1994 |
| EP | 1 063 569 A2 | 12/2000 |
| EP | 1 063 570 A2 | 12/2000 |
| JP | 10-284368 | 10/1998 |
| WO | WO 01/63233 A2 | 8/2001 |

OTHER PUBLICATIONS

D.A. Ansley, Resolution Testing of Coherent Optical Systems by Means of Linear Gratings, Applied Optics/vol. 9, No. 12, Dec. 1970, pp. 2746-2752.
European Search Report for Application No.: EP 04 07 8406, dated Apr. 26, 2005.

* cited by examiner

*Primary Examiner*—D. Rutledge
(74) *Attorney, Agent, or Firm*—Pillsbury Winthrop Shaw Pittman, LLP

(57) ABSTRACT

In one configuration of an arrangement according to an embodiment of the invention, a first grating patch on one module is aligned with a first grating patch on another module. In a different configuration of the arrangement, a second grating patch on the one module is aligned with a second grating patch on the other module. The two configurations are not aligned at the same time.

29 Claims, 5 Drawing Sheets

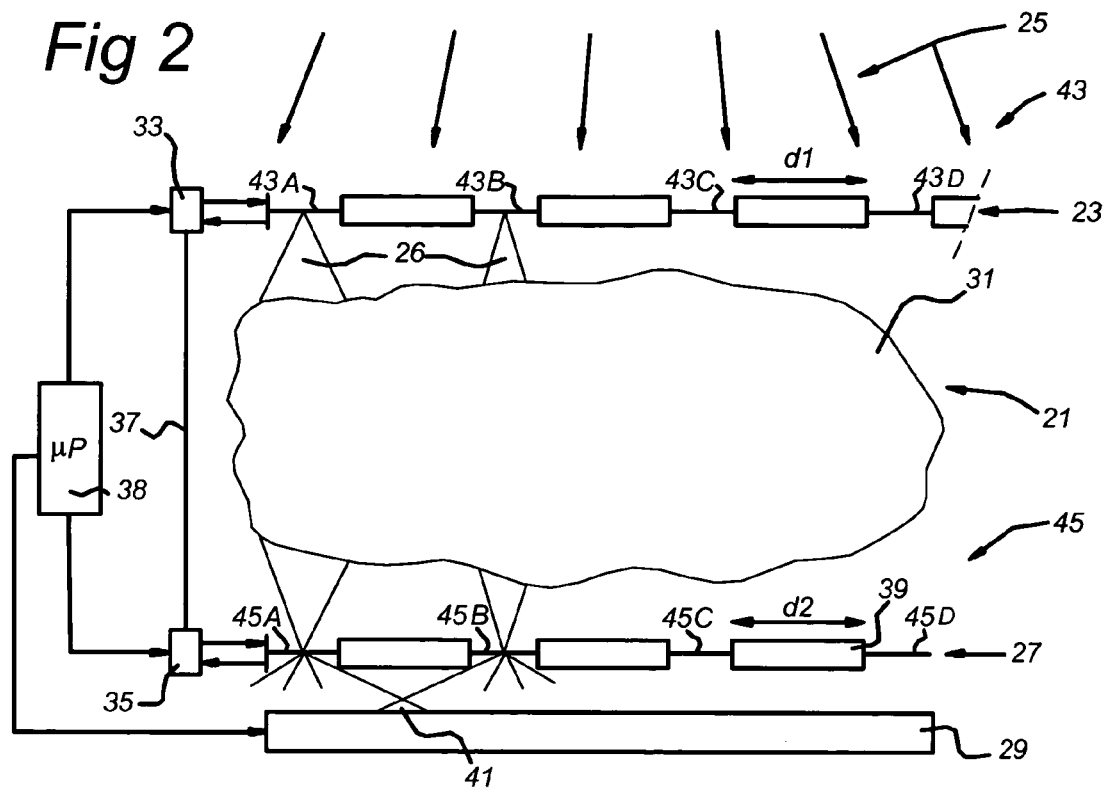
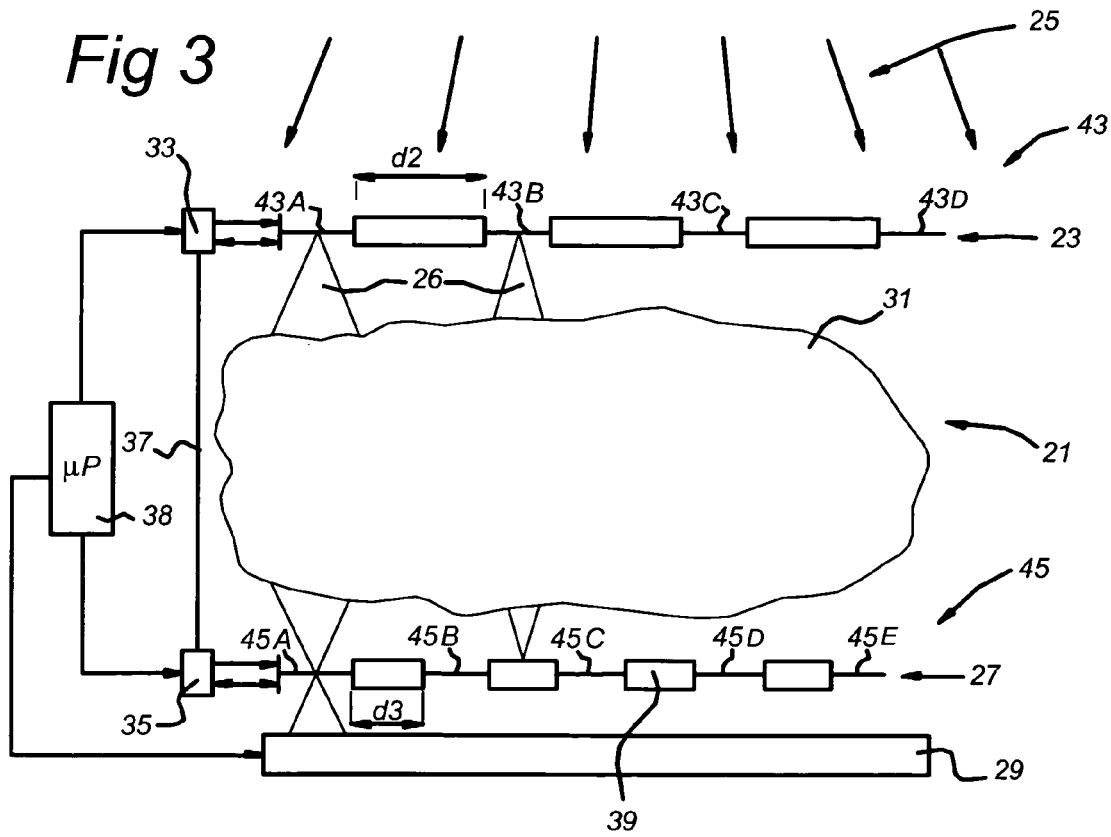

GRATING PATCH ARRANGEMENT, LITHOGRAPHIC APPARATUS, METHOD OF TESTING, DEVICE MANUFACTURING METHOD, AND DEVICE MANUFACTURED THEREBY

FIELD OF THE INVENTION

The present invention relates to lithographic projection apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, and catadioptric systems, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "wafer" or "die" in this text should be considered as being replaced by the more general terms "substrate" and "target portion", respectively.

It may be desirable to assess the optical properties of an illumination system and/or projection lens in a lithographic projection apparatus. It may also be desirable to obtain such assessment and/or to perform lens calibration without having to resort to exchange of hardware.

SUMMARY

An arrangement according to one embodiment of the invention includes a first set of grating patches arranged on a first side of a lens, the first set including a first grating patch and a second grating patch. The arrangement also includes a second set of grating patches arranged on a second side of the lens that is substantially optically opposite the first side, with the second set including a third grating patch and a fourth grating patch. At least one of the first and second sets is moveable with respect to the other. In a first configuration of the arrangement, the first and third grating patches are aligned, while in a second configuration of the arrangement, the second and fourth grating patches are aligned. The first and second configurations do not exist at the same time.

Lithographic apparatus including such an arrangement, and methods of testing, are also disclosed. Other embodiments of the invention include methods of lens calibration, lithographic apparatus including calibrated lenses, and device manufacturing methods and devices manufactured thereby.

BRIEF DESCRIPTION OF THE DRAWINGS

Embodiments of the invention will now be described, by way of example only, with reference to the accompanying schematic drawings in which:

FIG. 2 schematically shows a device for determining the optical properties of a lens according to the state of the art, FIG. 3 shows the proposed device in accordance with the present invention.

In the Figures, corresponding reference symbols indicate corresponding parts.

DETAILED DESCRIPTION

Embodiments of the invention include, for example, methods, apparatus, and measurement devices that may be used to obtain a swift, reliable, thorough and accurate determination of the optical properties of an optical system.

Figure 1:
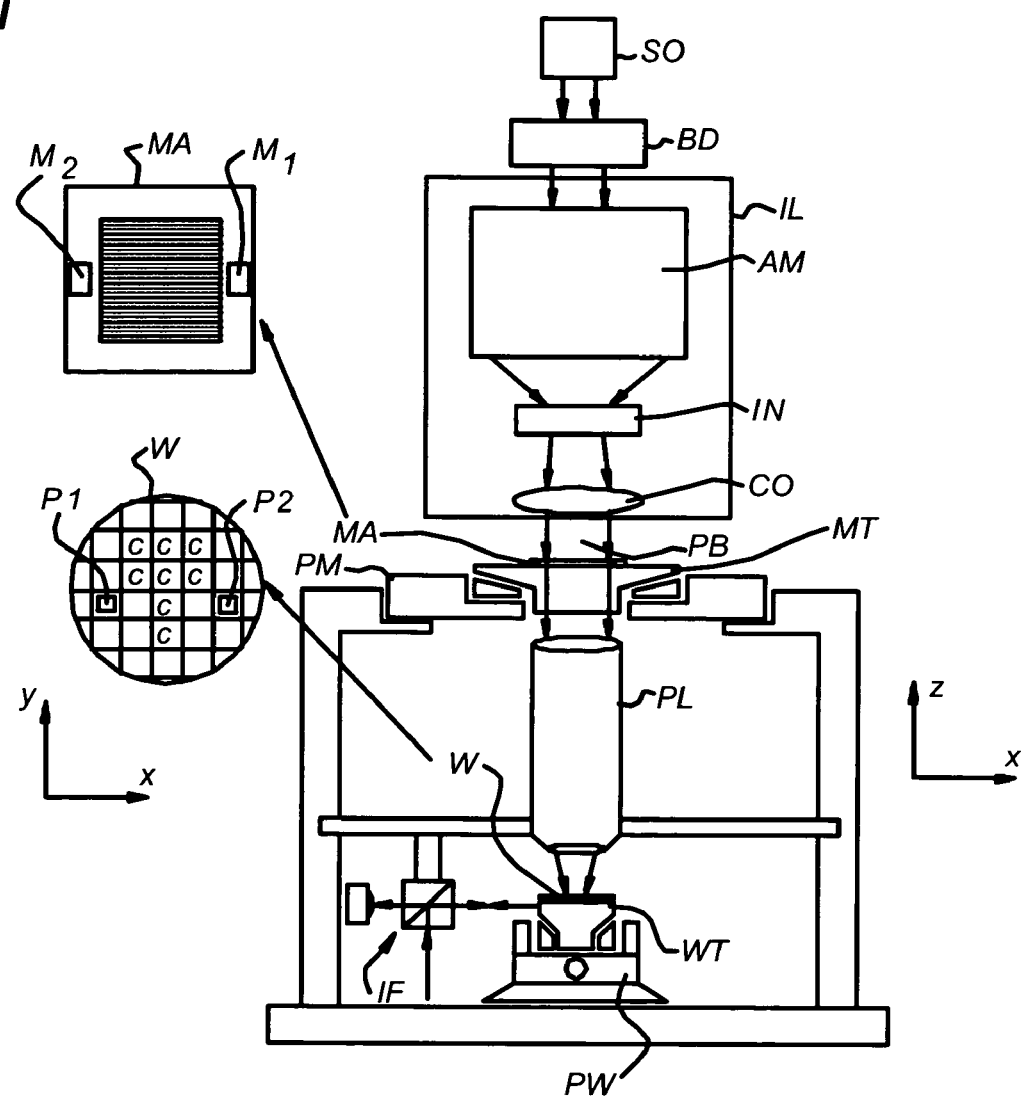
FIG. 1 depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system IL including adjusting structure AM for setting an illumination node, an integrator IN, and condensing optics CO.

A support structure configured to support a patterning structure capable of patterning the projection beam. In this example, a first object table (mask table) MT is provided with a mask holder for holding a mask MA (e.g. a reticle), and is connected to a first positioning structure for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable direction mirrors); this latter scenario is often the case when the source SO is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

It may be desirable to carry out several types of measurements to assess the optical properties of the illumination system and/or projection lens in a lithographic projection apparatus. International Patent Publication WO 01/63233A2 describes a measurement device that includes a source module located at the reticle level and a sensor module located at the substrate level. During a measurement, the projection lens is located in between the source and the sensor module.

In the following, the term "grating patch" indicates an area that includes one or more gratings. In the context of this application, the term "grating patch" may refer to, for example, a linear pattern (e.g. a raster pattern) or to a two-dimensional pattern (e.g. a pattern in the form of a chessboard). Currently known implementations of WO 01/63233A2 contain only one type of grating patch.

To improve the determination of different optical properties of the projection lens, different types of grating patches may be advantageous. Each grating patch may have a structure that is designed or optimized for a specific application. For instance, grating patch type A may include a small pitch grating which can be used for e.g. very fast measurements, grating patch type B may include a large pitch grating which can be used for e.g. very high resolution wave front measurements or enlarged measurement range, grating patch type C may include a pinhole which can be used e.g. for pupil measurements, and grating patch type D may be used e.g. for enlarged capture range. The pinhole in particular enables to obtain measurement data for the illumination system.

For every type of grating patch A, B, C and D located at the reticle level, a corresponding equivalent grating patch A, B, C and D may be present at the substrate level. A measurement beam is supplied to a grating patch at reticle level. The measurement beam travels through the grating patch at reticle level, and through the projection lens, until it reaches a corresponding grating patch at substrate level. A further sensor (e.g. a camera or other imaging sensor) located downstream of the grating patch at substrate level may determine the intensity of the transmitted measurement beam. A method of measuring more than one optical property at the same time as disclosed in US Patent Application 2003-0001107A1 may be used.

Here, an assembly is disclosed that comprises an image sensor module mounted on a substrate table. The image sensor module has image sensor mark patterns that include gratings having a certain pitch and line width. Mask mark patterns for cooperation with the series of sensor mark patterns are located at the mask. This assembly of image sensor mark patterns at wafer level cooperating with mask mark patterns at mask level may allow for measurements that determine lens aberrations, lens magnification and distortion and the focus plane of the lens, but may also allow alignment of the substrate table and mask pattern (mask table).

It may be desirable that grating patches are not located too close to each other, i.e. with an insufficient mutual distance in between them. A measurement beam that passes through the different gratings may be diffracted and scattered in different directions. This scatter may result in overlap of light supplied by the measurement beam at a detector (e.g. camera) placed behind the gratings at wafer level.

Until now, it has not been known how to prevent light supplied by the measurement beam from all but one of the patches from being transmitted to the camera, and it has been difficult or impossible to illuminate only one of the grating patches at mask level if these grating patches are placed too close together. If the patches are too close together, light from different grating patches may hit the camera, causing interference of light from different gratings on the detector. It may not be possible to separate the beams passing through (or from) the respective grating patches. Therefore, it has been difficult if not impossible to determine several different optical properties of the projection lens with the same sensor.

A device 21 for determining optical properties of a lens and/or an illumination system in general (the concept of a lens as used in this patent application has been described above) is explained in connection with FIG. 2. In FIG. 2, a module 23 and a module 27 are arranged above and below a lens 31, respectively. For example, the module 23 and the module 27 may be located in or near the focal planes of the lens 31, respectively. Grating patches 43 and 45 are present on the modules 23 and 27, respectively. The different grating patches present on the module 23 are indicated with reference numerals 43A, 43B, 43C, and 43D, respectively. On the module 27, grating patches corresponding to the grating patches 43A, 43B, 43C and 43D of module 23 are indicated with 45A, 45B, 45C and 45D, respectively.

The modules 23 and 27 can be shaped in quite an arbitrary way and may serve only to mount the grating patches 43 and 45 on them. In presently available lithographic projection apparatuses, grating patches 43 and 45 are often mounted on a reticle (i.e. mask), a source module (e.g. outside the pattern), or a fiducial module mounted in the reticle (i.e. mask) stage and on a sensor module, respectively. A source module may be exchangeable (e.g. like a reticle), or it can be an integrated part of the reticle stage.

The module 23 may be connected to a measurement and adjust unit 33, and the module 27 may be connected to a measurement and adjust unit 35. The measurement and adjust units 33 and 35 may be in mutual communication (e.g. via a link 37), and either or both may be connected to a processor unit 38 (e.g. a microprocessor, digital signal processor, or other programmable, programmed, or dedicated array of logic elements).

The module 23 may be illuminated by a beam of light 25, which may be diffracted by the grating patches 43 (43A–43D) to provide secondary beams 26 comprising diffraction orders. Under the module 27, a sensor 29 such as a camera is located. The sensor 29 is also connected to the processor unit 38. The diffraction orders of secondary beam 26 are imaged by lens 31 on the different grating patches 45A–45D that, again, diffract the received secondary beams 26. This diffraction may result in further diffraction orders impinging on detector 29. However, these further diffraction orders of different grating patches 45A–45D may overlap at the surface of the detector 29.

Diffraction, however, may not be the most important reason for overlap at the location of the camera. For example, overlap may be caused by the fact that the surface of the detector 29 (e.g. the camera) may be located a substantial distance from the module 27. This overlap is indicated by reference numeral 41.

From the module 27, the light may emerge under a large angle with the normal on this module 27. The grating patches 43A–43D are separated a distance d1 from each other, and the grating patches 45A–45D are separated a distance d2 from each other. In FIG. 2, for the sake of convenience, the lens 31 is drawn having a demagnification of 1, so d1 is equal to d2. Generally speaking, however, d1 and d2 may not be equal, as the lens 31 may have an effect on dimensions. It may be desirable or important that d1 is "matched" to d2. Demagnifications (reduction factors) commonly encountered in lithographic apparatus are 4 or 5, though it is possible to have other reduction factors as well. In between the grating patches 43A–43D and 45A–45D, the modules 23 and 27 comprise portions with numeral 39 of a material that blocks the beams of light 26. This material is, for example, chromium. The dimensions of these portions are schematically indicated by d1 and d2 in FIG. 2. These portions d1 and d2 are matched between successive grating patches 23A–23D and 45A–45D of modules 23 and 27, respectively. Both measurement and adjust units 33 and 35 as well as the detector 29 may be in communication with a microprocessor unit 38.

The device 21 may be operated in the following way. The illumination system of the lithographic apparatus illuminates the grating patches 43A–43D of module 23. The grating patches 43A–43D produce well-defined higher-order beams of light that pass through the lens 31. The grating patches 43A–43D permit only some well-defined orders of the beam of light 25 to travel as a secondary beam 26 through the grating patches 43 as a diffraction pattern and subsequently through the lens 31. Depending on the effects of the lens 31 on the beam 26, it may be possible to obtain information on optical properties of the lens 31.

The relative mutual position of the two modules 23 and 27 with respect to each other may be measured by measurement and adjust units 33 and 35, respectively. This relative position may be adjusted by the units 33 and 35 as controlled by the microprocessor unit 38. After traveling through the lens 31, the beam 26 impinges on the grating patches 45 of the module 27. The resulting diffraction pattern is detected by the sensor 29. The diffraction pattern detected by the sensor 29 may be used by the processor unit 38 to determine one or more optical properties of the lens 31.

Presently, if the diffraction patterns generated by grating patches 45A–45D are too close to each other, they may generate an overlapping part 41. This result may cause the pattern generated by grating patch 45A such as detected by the sensor 29 to be disturbed by the pattern generated by grating patch 45B. Solving such a problem by separating the grating patches 45A–45D (and 43A–43D) by a larger distance (e.g. by increasing d1) so that no overlap results on the detector 45 may lead to loss of valuable space on the modules 27 (and 23) where additional grating types may be placed. Therefore, it may be difficult to determine several optical properties without having to resort to exchange of hardware (for example, exchanging the modules 23 and 27 for different modules 23, 27 with e.g. different gratings for different properties of lens 31).

A solution to this problem is presented in FIG. 3. In FIG. 3, the same reference numerals refer to the same parts as used in connection with FIG. 2. The module 23 comprises different types of grating patches 43A–D. Corresponding types of grating patches 45A–D are present at the module 27. In FIG. 3 the different types of grating sets may be used to determine different properties of the lens 31. For instance, grating patches 43A, 45A may include a small pitch grating for very fast measurements, grating patches 43B, 45B may include a large pitch grating for very high resolution wave front measurements or for enlarged measurement range, and grating patches 43C, 45C may include a pinhole grating for pupil measurements. The separation between grating patches 43A and 43B located at the module 23 is given by d2, the separation between the corresponding grating patches 45A and 45B at module 27 is given by d3.

The following explanation is directed at grating patches 43A, 45A and 43B, 45B but may apply equally well to the other types of gratings. In order to prevent light from different types of grating patches from reaching the sensor 29, it may be desirable for the separation between the respective gratings to be such that no two different types of gratings may be aligned at the same time. This result may be achieved, for example, by choosing the distance d2 to be different from the distance d3. In an arrangement according to one embodiment of the invention, these distances are chosen such that the number of gratings per unit of length L that are present on the module 23 is not a multiple of the number of gratings per unit of length L that are present on the module 27. FIG. 3 shows an example in which the light passing through grating patch 43B does not reach the sensor 29 but instead is blocked by one of the parts 39 that forms the separation between the grating patches 45A–45D to block the light and is, for example, made out of chromium.

In an arrangement according to an embodiment of the invention, the grating patches 43A–43D are arranged such that they may only be aligned with their corresponding grating patches 45A–45D one at a time. Such a result can be ensured by choosing the distance between the respective grating patches accordingly, as will be appreciated by the skilled person. As an example, one could choose the number of grating patches on the module 23 with a constant equal inter-patch distance, such that after reduction by the lens 31 this number is not a multiple of the number of grating patches on the module 27. If the grating patches on the module 27 also are a constant equal inter-patch distance spaced apart, the distribution of the grating patches on the module 23 with respect to the module 27 may be such that no two grating patches—at least between certain limits—will be aligned at the same time.

When the inter-patch distances have been determined as described, it is of course possible to leave blank positions that would be occupied by "superfluous grating patches," i.e. grating patches on the module 27 (the module 23) that would not have a corresponding grating patch on the module 23 (respectively, the module 27). In this way, the number of grating patches on the module 23 may equal the number of grating patches on the module 27, and the inter-patch distance may be such that no two grating patches will be aligned at the same time. Another possibility is to determine an average distance between each pair of adjacent grating patches ("inter-patch distance") with respect to the grating patches at the wafer level and the inter-patch distance at mask level after demagnification of the projection lens projected on the wafer. The averages may not be the same.

Figure 4A:
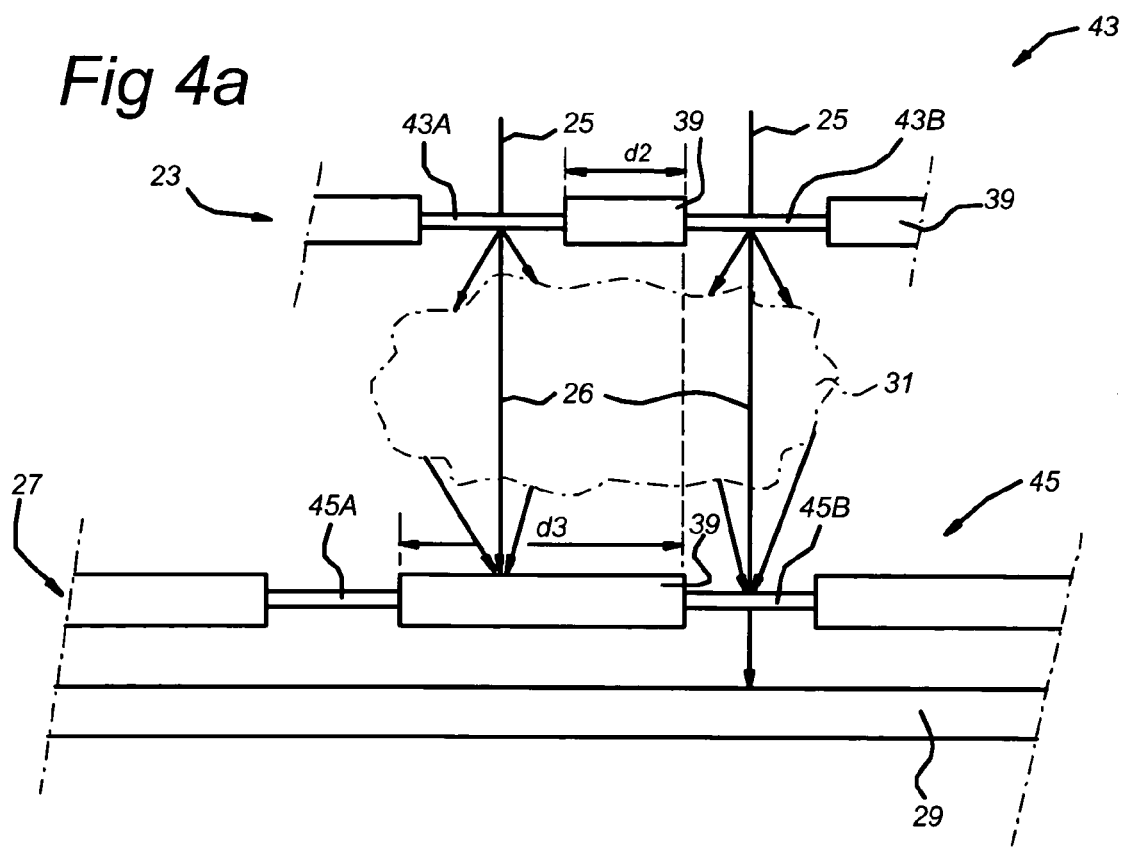
FIGS. 4a and 4b show a more detailed view (very schematic) of the principle on which the present invention is based.
Figure 4B:
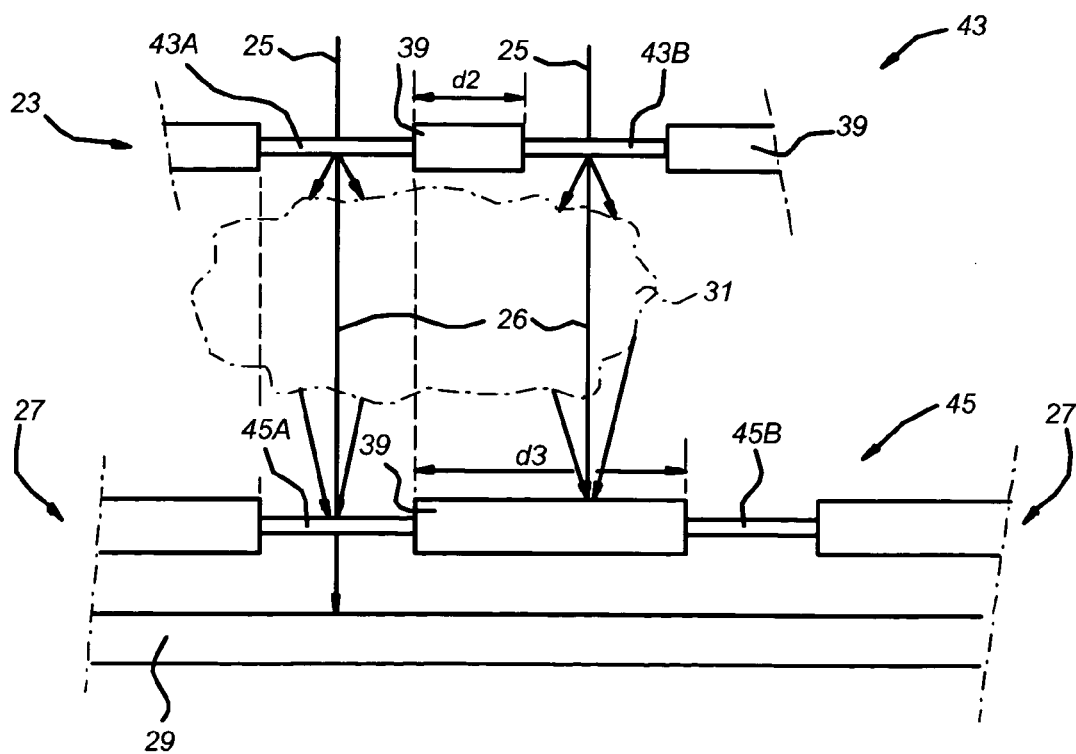

To clarify the invention further, reference is now made to FIGS. 4a and 4b, which include very schematic drawings. Once again, the same reference numerals refer to same parts as used in the previous figures. FIG. 4a illustrates a first position in which the modules 23 and 27 are placed in such a way that grating patches 43B, 45B are aligned. The secondary beam 26 passes through the grating patch 45B without being blocked. On the other hand, the secondary beam 26 generated by the grating patch 43A located at module 23 is subsequently blocked by chromium layer 39 of the module 27.

In FIG. 4b, the modules 23 and 27 have been moved by (at least one of) the measurement and adjust units 33 and/or 35. Now the grating patches 43A, 45A are aligned, and the light passing through grating patch 43B at module 23 is blocked. This result may be made possible by choosing the distances d2 and d3 between the respective gratings differently. The skilled person will easily appreciate that several configurations are possible. Moreover, embodiments of the invention are by no means limited to a set-up in one dimension, e.g. as illustrated in connection with the previous figures.

Figure 5:
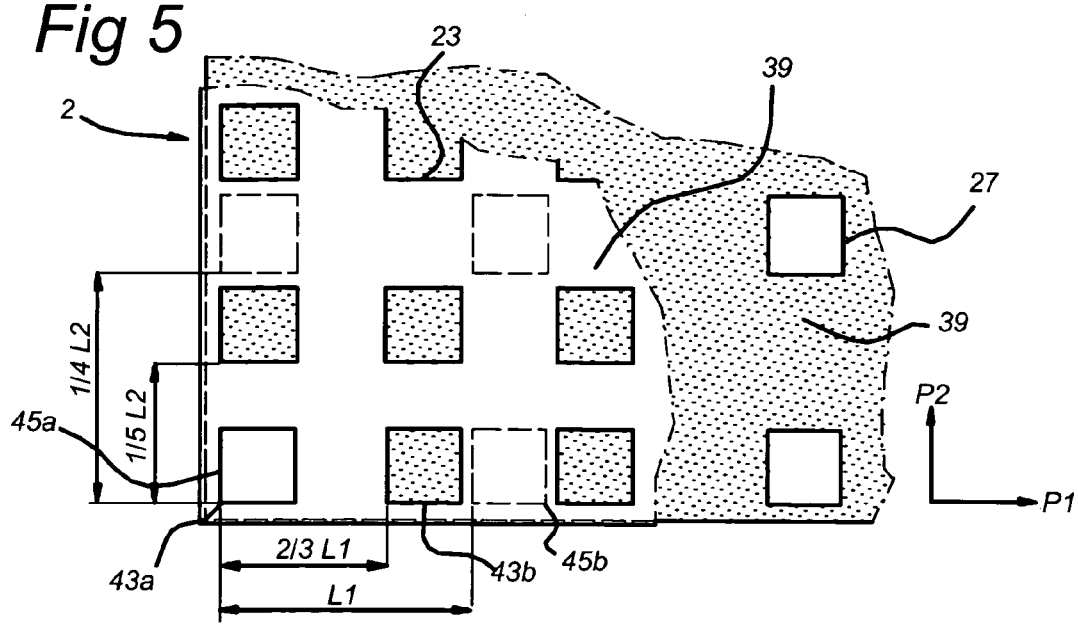
FIG. 5 shows schematically a possible distribution of gratings.

In FIG. 5, a two-dimensional set up is shown. The modules 23 and 27 are viewed from above (e.g. along a direction of beam 25 of FIG. 4). As indicated in FIG. 5, in a first direction p1, the number of grating patches has been chosen such that there are 3/2 grating patches per unit length L1 on module 23 and 1 grating patch per unit length L1 on the module 27. In a second direction p2 (which, in the case of FIG. 5, is perpendicular to the first direction p1), the number of grating patches on module 23 is 5 grating patches per unit length L2 and on module 27 the number is 4 grating patches per unit length L2. However, the angle between p1 and p2 may also be different from 90 degrees.

In this figure, the modules 23, 27 are positioned such that grating patches 43A and 45A are aligned. The other grating patches are positioned such that light passing through the upper module 23 is blocked by the chromium layer of the module 27. This is illustrated in FIG. 5 by shading the chromium layers 39 of module 27 and of module 23. Other alternatives, e.g. an angle other than 90 degrees of the first and second directions p1 and p2 relative to each other, will present themselves straightforwardly to the skilled person.

Figure 6:
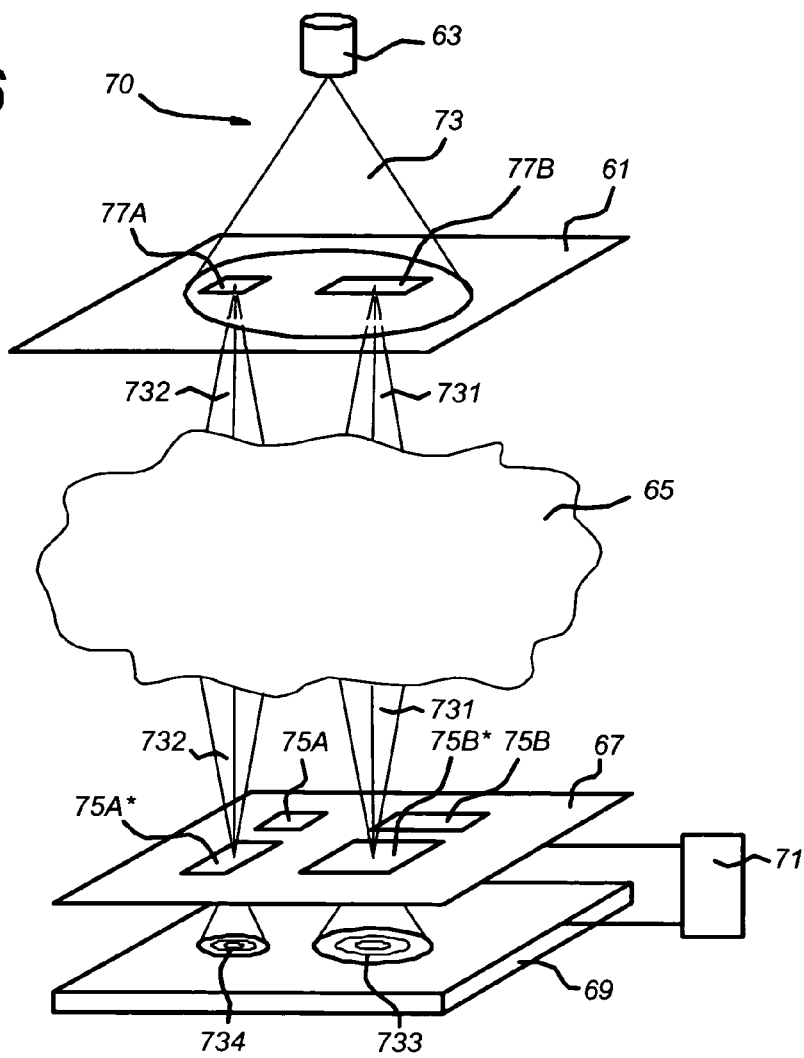
FIG. 6 illustrates a further embodiment of the invention and FIG. 7 illustrates a more economic usage of the space present on a portion of a wafer (or a mask) that is not used for lithographic purposes.

A further embodiment of the invention is explained with reference to FIG. 6. A device 70 is shown in FIG. 6 that comprises a first module 61 on which a grating patch 77A and a grating patch 77B are located. In the case of FIG. 6, two grating patches are shown, but the invention applies equally to a larger number of grating patches. The grating module 61 is also called "source module."

As shown in FIG. 6, under the module 61 a lens 65 is located. Under the lens 65 is a second module 67 (or "sensor module") with grating patches present. This module comprises a grating patch 75A, a grating patch 75B, a grating patch 75A*, and a grating patch 75B*, but once again a larger number is very well possible. Under the grating module 67, a detector 69 (e.g. a camera) is located. It may be desirable to move the detector 69 and the module 67 together (i.e. not to move them relative to one another) by an appropriate adjustment device 71.

A measurement beam 73 is provided by a radiation source 63. The measurement beam from the radiation source 63 is for clarity's sake drawn in a simplified, schematic way in FIG. 6. In practice, it may be desirable to ensure that the radiation source directs a cone of light with an angle corresponding to the numerical aperture of the lens 56 onto the grating patches 77A, 77B.

The device 70 may be used as follows. Light 73 travels from the radiation source 63 to the module 61 and illuminates the two grating patches 77A and 77B. The beam 73 is diffracted by the grating patches 77A and 77B. The diffraction orders that travel through the grating patches 77A and 77B are shown as beams indicated by reference numerals 732 and 731, respectively. These beams 732 and 731 travel through the lens 65 and hit the second module 67. It may be desirable to locate the modules 61 and 67 in opposite focal planes of the lens 65.

The beams 732 and 731 impinge on the grating patches 75A* and 75B*. Here they are diffracted again and create a diffraction pattern on the detector 69 (e.g. a camera or other optical or imaging sensor). The pattern for beam 732 is labeled as 734. The pattern for beam 731 is labeled as 733.

The grating patches 77A and 75A* have the same grating constant. The grating patches 77B and 75B* also have the same grating constant, although the grating constant of 77A/75A* may or may not be the same as the grating constant of 77B/75B*. The grating patches 75A and 75A*, however, differ in size, as do the grating patches 75B and 75B*. E.g., grating patches 75A and 75B, respectively, may be smaller than grating patches 75A* and 75B*, respectively.

The amount of power of the source 63 may vary. This variation may lead to a signal overflow (or underflow) on the camera. By exchanging the grating patches (for instance, using grating patch 75A instead of 75A*), an overflow may be avoided. It is also possible that the aberrations in the lens 65 are such that they may not be detected by a very small grating constant. In such case, a grating patch with a bigger grating constant present on the modules 61 and 67 may be used.

It may be desirable or important that the fringe patterns 734 and 733 do not overlap on the detector 69. Grating patches used in practice, for example, may have a grating constant corresponding to shear ratios with a value in the range between $1/10$ and $1/50$, and a size with a value in the range between (25 µm*25 µm) and (250 µm*250 µm). It may be desirable to choose the respective mutual distance between the grating patches present on the module 67 and the distance between the module 67 and the detector 69 in such a way that the fringe patterns 734 and 733 are separate (i.e. do not overlap).

Figure 7:
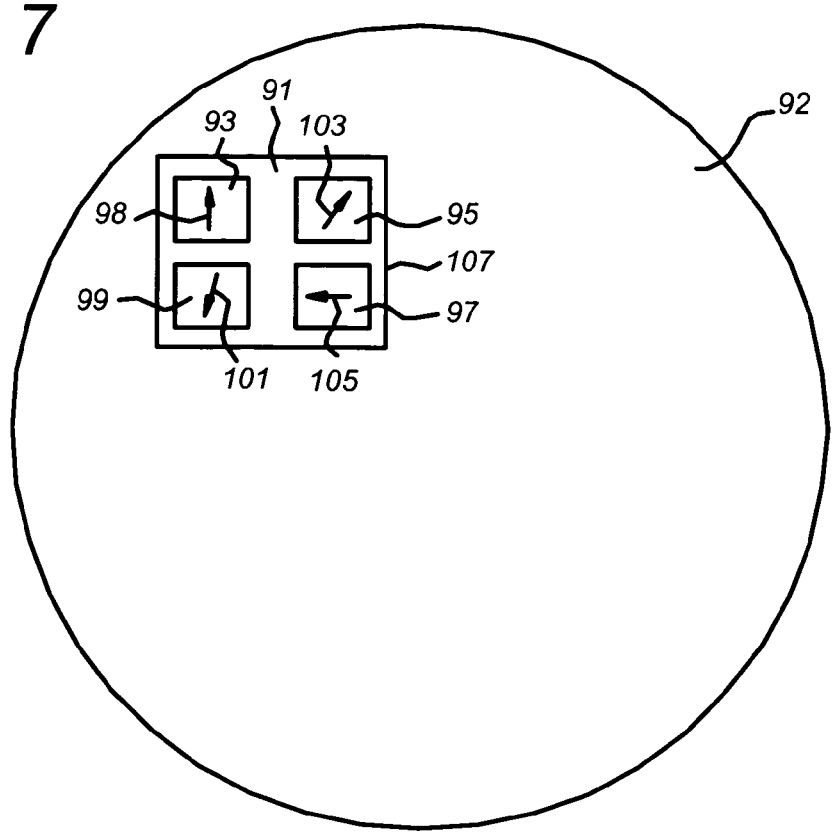
Figure 8:
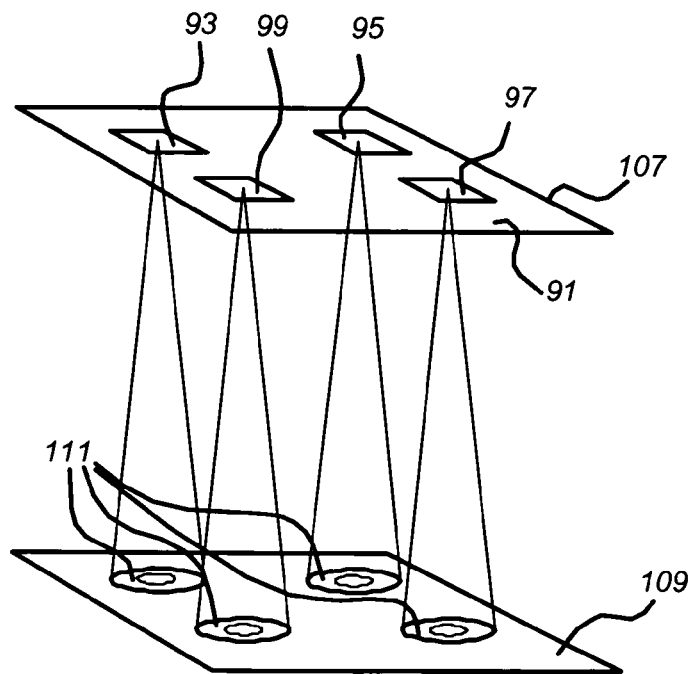
FIG. 8 shows how light projecting from several grating patches may form separate measurement spots on a detector.

FIG. 7 and FIG. 8 are used to explain a principle of obtaining a calibrated device for determining optical properties of a lens and possibly calibrating a lens at the same time (e.g. for a lithographic apparatus with a lens mounted in a lithographic apparatus). Such an operation may also be referred to as "on-tool calibration."

In FIG. 7, a module 92, such as a piece of glass, is shown as viewed from above. On the module 92, a portion 91 is reserved for measurement equipment. This portion 91 may comprise a contour. The contour is shown in FIG. 7 as a rectangle 107, but may have any arbitrary shape. Inside the contour 107, several grating patches have been created. The grating patches are referred to with reference numerals 93, 95, 97 and 99. The grating patches 93, 95, 97 and 99 may be used in determining an optical property of a lens. The orientation of the grating patches 93, 95, 97 and 99 is symbolically indicated by arrows 98, 103, 105 and 101 respectively. FIG. 7 shows the grating patches at wafer level. Corresponding grating patches (not shown) may be present at mask level.

In FIG. 8, which is a view in 3 dimensions at the portion 91 of the module 92 of FIG. 7, the same reference numerals are used as in FIG. 7. In addition, in FIG. 8 a plane 109 of a light-sensitive device such as a camera (also referred to as module) is shown. On the plane 109, which is also referred to as "fringe plane," a diffraction pattern of a measurement beam 111 generated by the gratings 93, 95, 97 and 99 is projected.

An assembly as shown in FIG. 8 may be used as follows. In one example, the portion 91 comprises only one grating, e.g. grating 93 of FIG. 7. This grating 93 may be oriented according to the arrow 98. Measurement beam 111 is generated by this grating 93 and hits the surface plane 109 of a detector (for instance, a camera). The resulting fringe pattern may only occupy roughly one fourth of the space available on the module 109 of the camera. As an example, when the surface plane 109 corresponds to, e.g., an array of 1024* 1024 pixels available on the plane 109, and assuming a diffraction pattern from an individual grating fills an area of 512*512 pixels, it may be possible to accommodate four times the same grating 93 i.e. with the same orientation.

It is also possible to accommodate multiple additional gratings 95, 97 and 99, e.g. having different orientations as indicated by the different arrows 103, 105 and 101, respectively. One potential advantage of such an arrangement is that no rotations of the portion 91 (and the module 92) may be needed to rotate grating 93 to another orientation corresponding to an orientation of any of gratings 103, 105 or 101, respectively. In general, both the lens and the detector may have aberrations. By measuring in more than one direction at the same time, it may be possible to obtain a more accurate measurement value for the different aberrations of the lens and of the detector.

It may be desirable to avoid any overlap between the diffraction patterns of the beams 111. As explained above in connection with the embodiment shown in FIG. 6, it may be desirable to select a distance between the grating patches 93, 95, 97 and 99 and/or a distance between the plane 109 and the portion 107, e.g. to order to avoid such overlap.

Measurement techniques as described in this application may include the detection of one or more interference patterns, as is known to persons skilled in the art. Modules as described herein may be exchangeable or nonexchangeable in relation to a device or apparatus with which they are used (e.g. to measure or calibrate a lens or projection system).

Some embodiments of the invention relate to a first grating patch set comprising at least a first grating patch designed for determining a first optical property of a lens, said first set designed to be located at a first side of said lens and a second grating patch set comprising at least a second grating patch corresponding to said first grating patch, said second grating patch set designed to be located at a second side of said lens.

The first set grating patch set may further comprise a further first grating patch designed for determining a second optical property of said lens, said first and further first grating patches of said first grating patch set being located at a first mutual distance to each other, said second grating patch set further comprises a further second grating patch corresponding to said further first grating patch, said second and further second grating patches of said second grating patch set being located at a second mutual distance to each other, said first grating patch set is movable relative to said second grating patch set and said first mutual distance relative to said second mutual distance is such that it is only possible to completely align simultaneously either said first and second grating patches or said further first and further second grating patches.

In this way, only one grating patch at mask level can be aligned with its corresponding grating patch at wafer level at the same time. This means that the measurement beam going through other grating patches at mask level is blocked and by consequence does not interfere with the measurement. No light from the measurement beam going through the other grating patch(es) at mask level (i.e. the grating patches that are not aligned with their corresponding grating patches) can pass the grating patch set at wafer level.

In an arrangement according to another embodiment of the invention, said first and second optical property differ from one another. This may enable a fast determination of different optical properties of a lens and illumination system and/or avoid a need for time consuming exchanges of hardware.

In an arrangement according to a further embodiment of the invention, said first grating patch set comprises a first plurality of grating patches, said first plurality defining a first average inter grating patch distance, said first grating patches having a first size and said second grating patch set comprises a second plurality of grating patches, said second plurality defining a second average inter grating patch distance said second grating patches having a second size, said lens having a reduction factor and in that said first size divided by said reduction factor equals said second size, said first average divided by said reduction factor is different from said second average.

By fulfilling these conditions, the distribution of the gratings may be—within certain limits—automatically "correct", i.e. such that no two types of grating patches are aligned simultaneously.

A device according to a further embodiment of the invention comprises a sensor arranged such that it is able to measure an optical property of said lens after said beam has traveled through said second set. Advantages of processing a measurement by an (electronic) sensor are evident.

A further problem of the art is that presently no gratings are available that can be used for measurements in a wide range of conditions. Among the conditions that may occur during a measurement on an optical (lens) system are a large aberration in the optical system and/or sudden changes in intensity of the measurement beam.

It is presently another problem to obtain both a calibrated lens and a calibrated sensor for determining optical properties of a lens once the lens is mounted in a lithographic projection apparatus.

A device according to a further embodiment of the invention includes a first grating patch set comprising at least a first grating patch, said first grating patch having a first pitch and a first size, said first set designed to be located at a first side of a lens, a second grating patch set comprising at least a second grating patch corresponding to said first grating patch, said second set designed to be located at a second side of said lens, a detector located a distance behind said second grating patch set on which detector, when the device is in use, at least one measurement spot is generated by a measurement beam projecting through a grating patch of said second set, characterized in that, said second grating patch set further comprises at least a further second grating patch with a second pitch and a second size at least one of said second pitch and said second size being different from at least one of said first pitch and said first size.

A device according to a further embodiment of the invention includes a first grating patch set comprising at least a first grating patch with a first orientation, said first grating patch set designed to be located at a first side of a lens, a second grating patch set comprising at least a second grating patch corresponding to said first grating, said second set designed to be located at a second side of said lens, and a detector located a first distance behind said second grating patch set on which detector, when the device is in use, at least one a measurement spot is generated by a measurement beam projecting through a grating patch of said second set, characterized in that, said first set further comprises at least a further first grating patch with a second orientation different from said first orientation, said first grating patch being located at a first distance from said further first grating patch, said second set further comprises at least a further second grating patch with an orientation equal to said second orientation, said second grating patch being located at a second distance from said further second grating patch and at least one of said first distance and said second distance is such that, while the device is in use, only separate measurement spots are generated on said detector.

A lithographic apparatus according to an embodiment of the invention includes an illumination system for providing a projection beam of radiation, a support structure for supporting patterning means, the patterning means serving to impart the projection beam with a pattern in its cross-section, a substrate table for holding a substrate; a projection system for projecting the patterned beam onto a target portion of the substrate; and a device as described herein.

Embodiments of the invention also include methods of testing a lens with a device as described herein, and a lithographic apparatus comprising such a tested lens, as well as any device manufactured with such a lithographic apparatus.

Whilst specific embodiments of the invention have been described above, it will be appreciated that the invention as claimed may be practiced otherwise than as described. For instance, features of all different embodiments described above may be combined where appropriate; e.g., principles as shown in FIGS. 3–5 may be applied to arrangements as shown in FIGS. 6–8. Further embodiments of the method may also include one or more computers, processors, and/or processing units (e.g. arrays of logic elements) configured to control an apparatus to perform a method as described herein, or a data storage medium (e.g. a magnetic or optical disk or semiconductor memory such as ROM, RAM, or flash RAM) configured to include instructions (e.g. executable by an array of logic elements) describing such a method. It is explicitly noted that the description of these embodiments is not intended to limit the invention as claimed.

The invention claimed is:

1. An arrangement comprising:
   a first set of grating patches arranged on a first side of a lens, said first set including a first grating patch and a second grating patch; and
   a second set of grating patches arranged on a second side of the lens, said second side being substantially optically opposite the first side, said second set including a third grating patch and a fourth grating patch,
   wherein at least one of the first and second sets is moveable with respect to the other,
   wherein in a first configuration of the arrangement the first and third grating patches are optically aligned so that light emitted from the first grating patch passes through the third grating patch,
   wherein in a second configuration of the arrangement the second and fourth grating patches are optically aligned so that light emitted from the second grating patch passes through the fourth grating patch, and
   wherein the first and second set of grating Patches are arranged with respect to each other so as to preclude the first and second configurations from occurring at a same time.

2. The arrangement according to claim 1, wherein a first set of configurations of the arrangement includes all configurations in which the first and third grating patches are aligned, and
   wherein a second set of configurations of the arrangement includes all configurations in which the second and fourth grating patches are aligned, and
   wherein the first and second sets of configurations are mutually exclusive in time.

3. The arrangement according to claim 1, wherein in the first and second configurations of the arrangement, the first set lies at least substantially within a focal plane of the lens on the first side, and the second set lies at least substantially within a focal plane of the lens on the second side.

4. The arrangement according to claim 1, wherein, in response to an impinging beam of radiation, the first grating patch is configured to emit light that is affected in a first manner by the lens, and
   wherein, in response to the impinging beam of radiation, the second grating patch is configured to emit light that is affected in a second manner by the lens, the second manner being different from the first manner.

5. The arrangement according to claim 1, wherein when the first and third grating patches are optically aligned, light affected by the first grating patch impinges on the third grating.

6. The arrangement according to claim 1, wherein when the first and third grating patches are optically aligned, light affected by the first grating patch is directed by the lens to impinge on the third grating.

7. An arrangement comprising:
   a first set of grating patches arranged on a first side of a lens, said first set including a first grating patch and a second grating patch; and
   a second set of grating patches arranged on a second side of the lens, said second side being substantially optically opposite the first side, said second set including a third grating patch and a fourth grating patch,
   wherein at least one of the first and second sets is moveable with respect to the other,
   wherein in a first configuration of the arrangement the first and third grating patches are optically aligned so that light emitted from the first grating patch passes through the third grating patch,
   wherein in a second configuration of the arrangement the second and fourth grating patches are optically aligned so that light emitted from the second grating patch passes through the fourth grating patch,
   wherein the first and second set of grating patches are arranged with respect to each other so as to preclude the first and second configurations from occurring at a same time,
   wherein, in response to an impinging beam of radiation, the first grating patch is configured to emit light that is affected in a first manner by the lens, and
   wherein, in response to the impinging beam of radiation, the second grating patch is configured to emit light that is affected in a second manner by the lens, the second manner being different from the first manner, said arrangement further comprising a sensor configured to measure an optical property of the lens based on at least one among (1) light emitted by the first grating patch and passing through the third grating patch and (2) light emitted by the second grating patch and passing through the fourth grating patch.

8. An arrangement comprising:
   a first set of grating patches arranged on a first side of a lens, said first set including a first grating patch and a second grating patch; and
   a second set of grating patches arranged on a second side of the lens, said second side being substantially optically opposite the first side, said second set including a third grating patch and a fourth grating patch,
   wherein at least one of the first and second sets is moveable with respect to the other,
   wherein in a first configuration of the arrangement the first and third grating patches are optically aligned,
   wherein in a second configuration of the arrangement the second and fourth grating patches are optically aligned,
   wherein the first and second configurations do not exist at a same time, wherein the first set of grating patches includes a first plurality of grating patches, said first plurality including the first and second grating patches and being characterized by a first average inter-patch distance, wherein the second set of grating patches includes a second plurality of grating patches, said second plurality including the third and fourth grating patches and being characterized by a second average inter-patch distance, and wherein a ratio between the first and second average inter-patch distances is substantially different from a reduction factor of the lens.

9. The arrangement according to claim 8, wherein each of the first plurality of grating patches has a first size, and wherein each of the second plurality of grating patches has a second size, and wherein a ratio between the first size and the second size is substantially equal to the reduction factor of the lens.

10. An arrangement comprising:

a first set of grating patches arranged on a first side of a lens, said first set including a first grating patch and a second grating patch; and a second set of grating patches arranged on a second side of the lens, said second side being substantially optically opposite the first side, said second set including a third grating patch and a fourth grating patch, wherein at least one of the first and second sets is moveable with respect to the other, wherein in a first configuration of the arrangement the first and third grating patches are optically aligned, wherein in a second configuration of the arrangement the second and fourth grating patches are optically aligned, wherein the first and second configurations do not exist at a same time, wherein a ratio between a size of the first grating patch and a size of the third grating patch is substantially equal to a reduction factor of the lens, and wherein a ratio between (1) the distance from the first grating patch to the second grating patch and (2) the distance from the third grating patch to the fourth grating patch is substantially different than the reduction factor of the lens.

11. An arrangement comprising:

a first set of grating patches arranged on a first side of a lens, said first set including a first grating patch and a second grating patch; and a second set of grating patches arranged on a second side of the lens, said second side being substantially optically opposite the first side, said second set including a third grating patch and a fourth grating patch, wherein at least one of the first and second sets is moveable with respect to the other, wherein in a first configuration of the arrangement the first and third grating patches are optically aligned, wherein in a second configuration of the arrangement the second and fourth grating patches are optically aligned, wherein the first and second configurations do not exist at a same time, wherein said first and second grating patches are separated by a distance not less than a width of the most narrow of the first and second grating patches.

12. An arrangement comprising:

a first set of grating patches arranged on a first side of a lens, said first set including at least a first grating patch; and a second set of grating patches arranged on a second side of the lens, said second side being substantially optically opposite the first side, said second set including a second grating patch, corresponding to the first grating patch, and a third grating patch; and a detector arranged on a side of the second set of grating patches opposite the lens and configured to detect a measurement beam passing through said second set, wherein the first grating patch has a first size and a first pitch, wherein the third grating patch has a second size and a second pitch, at least one of the second size and the second pitch differing from the first size and the first pitch, respectively, wherein the detector is configured to detect a first measurement beam passing through said second grating patch and a second measurement beam passing through said third grating patch, and wherein said second and third grating patches are arranged such that a measurement spot generated by the first measurement beam at said detector and a measurement spot generated by the second measurement beam at said detector do not overlap.

13. The arrangement according to claim 12, wherein at least one of the first and the second grating patches has at least one of a grating pitch corresponding to a shear ratio with a value in the range between $\frac{1}{10}$ and $\frac{1}{50}$ and a size with a value in the range between (25 microns by 25 microns) and (250 microns by 250 microns).

14. An arrangement comprising:

a first set of grating patches arranged on a first side of a lens, said first set including a first grating patch having a first orientation and a second grating patch having a second orientation;

a second set of grating patches arranged on a second side of the lens, said second side being substantially optically opposite the first side, said second set including a third grating patch corresponding to the first grating patch and a fourth grating patch having the second orientation; and a detector arranged on a side of the second set of grating patches opposite the lens and configured to detect a first measurement beam passing through said third grating patch and a second measurement beam passing through said fourth grating patch, wherein the first and second grating patches are separated by a first distance and the third and fourth grating patches are separated by a second distance, at least one of the first and second set of grating patches being moveable with respect to one another, wherein in a first configuration of the arrangement the first and third grating patches are optically aligned so that light emitted from the first grating patch passes through the third grating patch, wherein in a second configuration of the arrangement the second and fourth grating patches are optically aligned so that light emitted from the second grating patch passes through the fourth grating patch, the first distance and the second distance being selected so as to preclude the first and second configurations from occurring at a same time.

15. A lithographic apparatus comprising:

a radiation system configured to provide a beam of radiation;

a first set of grating patches including a first grating patch and a second grating patch, the first set being configured to affect the beam of radiation;

a second set of grating patches including a third grating patch and a fourth grating patch; and a projection system configured to project the affected beam onto at least a portion of the second set, wherein the apparatus is configured to move at least one of the first and second sets with respect to the other, wherein in a first configuration of the apparatus the first and third grating patches are optically aligned with respect to the beam of radiation so that light emitted from the first grating patch passes through the third grating patch, wherein in a second configuration of the apparatus the second and fourth grating patches are optically aligned with respect to the beam of radiation so that light emitted from the second grating patch passes through the fourth grating patch, and wherein the first and second set of grating patches are arranged with respect to each other so as to preclude the first and second configurations from occurring at a same time.

16. The lithographic apparatus according to claim 15, wherein a first set of configurations of the apparatus includes all configurations in which the first and third grating patches are optically aligned, and wherein a second set of configurations of the apparatus includes all configurations in which the second and fourth grating patches are optically aligned, and wherein the first and second sets of configurations are mutually exclusive in time.

17. The lithographic apparatus according to claim 15, wherein in the first and second configurations of the apparatus, the first set lies at least substantially within a focal plane of the projection system on the first side, and the second set lies at least substantially within a focal plane of the projection system on the second side.

18. The lithographic apparatus according to claim 15, wherein the first grating patch is configured to emit light that is affected in a first manner by the projection system, and wherein the second grating patch is configured to emit light that is affected in a second manner by the projection system, the second manner being different from the first manner.

19. The lithographic apparatus according to claim 18, said apparatus further comprising a sensor configured to measure an optical property of the projection system based on at least one among (1) light emitted by the first grating patch and passing through the third grating patch and (2) light emitted by the second grating patch and passing through the fourth grating patch.

20. The lithographic apparatus according to claim 15, wherein when the first and third grating patches are optically aligned, light affected by the first grating patch impinges on the third grating.

21. The lithographic apparatus according to claim 15, wherein when the first and third grating patches are optically aligned, light affected by the first grating patch is directed by the projection system to impinge on the third grating.

22. A lithographic apparatus comprising:
a radiation system configured to provide a beam of radiation;
a first set of grating patches including a first grating patch and a second grating patch, the first set being configured to affect the beam of radiation;
a second set of grating patches including a third grating patch and a fourth grating patch; and
a projection system configured to project the affected beam onto at least a portion of the second set,
wherein the apparatus is configured to move at least one of the first and second sets with respect to the other,
wherein in a first configuration of the apparatus the first and third grating patches are aligned with respect to the beam of radiation,
wherein in a second configuration of the apparatus the second and fourth grating patches are aligned with respect to the beam of radiation,
wherein the first and second configuration do not exist at a same time,
wherein the first set of grating patches includes a first plurality of grating patches, said first plurality including the first and second grating patches and being characterized by a first average inter-patch distance,
wherein the second set of grating patches includes a second plurality of grating patches, said second plurality including the third and fourth grating patches and being characterized by a second average inter-patch distance, and
wherein a ratio between the first and second average inter-patch distances is substantially different from a reduction factor of the projection system.

23. A lithographic apparatus comprising:
a radiation system configured to provide a beam of radiation;
a first set of grating patches including a first grating patch and a second grating patch, the first set being configured to affect the beam of radiation;
a second set of grating patches including a third grating patch and a fourth grating patch; and
a projection system configured to project the affected beam onto at least a portion of the second set,
wherein the apparatus is configured to move at least one of the first and second sets with respect to the other,
wherein in a first configuration of the apparatus the first and third grating patches are optically aligned with respect to the beam of radiation so that light emitted from the first grating patch passes through the third grating patch,
wherein in a second configuration of the apparatus the second and fourth grating patches are optically aligned with respect to the beam of radiation so that light emitted from the second grating patch passes through the fourth grating patch,
wherein the first and second set of grating patches are arranged with respect to each other so as to preclude the first and second configuration from occurring at a same time,
wherein each of the grating patches in the first set has a first size,
wherein each of the grating patches in the second set has a second size, and
wherein a ratio between the first size and the second size is substantially equal to the reduction factor of the projection system.

24. A lithographic apparatus comprising:
a radiation system configured to provide a beam of radiation;
a first set of grating patches including a first grating patch and a second grating patch, the first set being configured to affect the beam of radiation;
a second set of grating patches including a third grating patch and a fourth grating patch; and
a projection system configured to project the affected beam onto at least a portion of the second set,
wherein the apparatus is configured to move at least one of the first and second sets with respect to the other, wherein in a first configuration of the apparatus the first and third grating patches are aligned with respect to the beam of radiation, wherein in a second configuration of the apparatus the second and fourth grating patches are aligned with respect to the beam of radiation, wherein the first and second configuration do not exist at a same time, wherein a ratio between a size of the first grating patch and a size of the third grating patch is substantially equal to a reduction factor of the projection system, and wherein a ratio between (1) the distance from the first grating patch to the second grating patch and (2) the distance from the third grating patch to the fourth grating patch is substantially different than the reduction factor of the projection system.

25. A method of testing, said method comprising:

arranging a first set of grating patches on a first side of a lens, said first set including a first grating patch and a second grating patch; and arranging a second set of grating patches on a second side of the lens, said second side being substantially optically opposite the first side, said second set including a third grating patch and a fourth grating patch, moving at least one of the first and second sets with respect to the other to a first configuration wherein the first and third grating patches are optically aligned so that light emitted from the first grating patch passes through the third grating patch;

obtaining information relating to a first optical property of the lens while the first and second sets are in the first configuration;

moving at least one of the first and second sets with respect to the other to a second configuration wherein the second and fourth grating patches are optically aligned so that light emitted from the second grating patch passes through the fourth grating patch; and obtaining information relating to a second optical property of the lens, different from the first optical property, while the first and second sets are in the second configuration, wherein the first and second set of grating patches are arranged with respect to each other so as to preclude the first and second configurations from occurring at a same time.

26. The method of testing according to claim 25, wherein the information relating to a first optical property of the lens is based on light of one diffraction order that passes through the third grating patch, and wherein the information relating to a second optical property of the lens is based on light of another diffraction order that passes through the fourth grating patch.

27. The method of testing according to claim 25, said method further comprising using the lens to project a patterned beam of radiation onto a target portion of a substrate, the target portion being at least partially covered by a layer of radiation-sensitive material.

28. A device manufacturing method according to the method of claim 27.

29. The method of testing according to claim 25, wherein the lens is an element of a projection system of a lithographic apparatus.

* * * * *